United States Patent
Chiang et al.

(10) Patent No.: US 9,690,892 B2
(45) Date of Patent: Jun. 27, 2017

(54) MASKS BASED ON GATE PAD LAYOUT PATTERNS OF STANDARD CELL HAVING DIFFERENT GATE PAD PITCHES

(71) Applicant: TAIWAN SEMICONDUCTOR MANUFACTURING COMPANY, LTD., Hsinchu (TW)

(72) Inventors: Ting-Wei Chiang, New Taipei (TW); Shun Li Chen, Tainan (TW); Yi-Hsun Chiu, Zhubei (TW); Li-Chun Tien, Tainan (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 337 days.

(21) Appl. No.: 14/330,684

(22) Filed: Jul. 14, 2014

(65) Prior Publication Data

US 2016/0012169 A1    Jan. 14, 2016

(51) Int. Cl.
*G06F 17/50*  (2006.01)
*H01L 29/06*  (2006.01)
*B82Y 40/00*  (2011.01)

(52) U.S. Cl.
CPC ...... *G06F 17/5072* (2013.01); *H01L 29/0665* (2013.01); *B82Y 40/00* (2013.01); *Y10S 977/938* (2013.01)

(58) Field of Classification Search
CPC . G06F 17/5072; B82Y 40/00; Y10S 977/938; H01L 29/0665
See application file for complete search history.

(56) References Cited

U.S. PATENT DOCUMENTS

| | | | | |
|---|---|---|---|---|
| 7,685,551 | B2* | 3/2010 | Toubou | G06F 17/5072 716/119 |
| 7,898,284 | B2* | 3/2011 | Martin | B82Y 10/00 326/10 |
| 7,986,042 | B2* | 7/2011 | Or-Bach | H01L 21/26506 257/773 |
| 8,208,279 | B2* | 6/2012 | Lue | H01L 27/0688 365/148 |
| 8,216,902 | B2* | 7/2012 | Chang | B82Y 10/00 257/E21.645 |
| 8,633,537 | B2* | 1/2014 | Polishchuk | H01L 29/4234 257/324 |
| 8,644,059 | B2* | 2/2014 | Asao | G11C 11/16 365/158 |

(Continued)

*Primary Examiner* — Naum B Levin
(74) *Attorney, Agent, or Firm* — Hauptman Ham, LLP

(57) ABSTRACT

A layout design usable for manufacturing a standard cell includes a first gate pad layout pattern, a first set of channel structure layout patterns overlapping the first gate pad layout pattern, a second gate pad layout pattern, and a second set of channel structure layout patterns overlapping the second gate pad layout pattern. The first gate pad layout pattern extends along a first direction. The second gate pad layout pattern extends along a second direction. The first set of channel structure layout patterns is arranged into a first number of columns each aligned along the first direction. The second set of channel structure layout patterns is arranged into a second number of columns each aligned along the first direction. The first number and the second number are different.

20 Claims, 6 Drawing Sheets

(56) References Cited

U.S. PATENT DOCUMENTS

| | | | | |
|---|---|---|---|---|
| 8,756,551 B2* | 6/2014 | Becker | ............... | G06F 17/5068 |
| | | | | 716/118 |
| 9,070,872 B2* | 6/2015 | Huo | ................... | H01L 27/0688 |
| 9,276,108 B2* | 3/2016 | Liaw | ................... | H01L 29/7827 |
| 2005/0237405 A1* | 10/2005 | Ohkawa | ............ | H01L 27/14641 |
| | | | | 348/308 |
| 2008/0135949 A1* | 6/2008 | Lo | ......................... | B82Y 10/00 |
| | | | | 257/401 |
| 2010/0090265 A1* | 4/2010 | Bhattacharyya | ....... | B82Y 10/00 |
| | | | | 257/315 |
| 2011/0031473 A1* | 2/2011 | Chang | ................... | B82Y 10/00 |
| | | | | 257/24 |
| 2011/0161909 A1* | 6/2011 | Becker | ............... | G06F 17/5068 |
| | | | | 716/122 |
| 2014/0332859 A1* | 11/2014 | Colinge | ............ | H01L 29/42376 |
| | | | | 257/288 |
| 2015/0234964 A1* | 8/2015 | Fu | ...................... | G06F 17/5045 |
| | | | | 716/103 |
| 2015/0295040 A1* | 10/2015 | Tsai | ................... | H01L 29/0676 |
| | | | | 257/371 |
| 2015/0303259 A1* | 10/2015 | Chen | ................... | H01L 29/0676 |
| | | | | 257/9 |
| 2015/0303270 A1* | 10/2015 | Liaw | ................. | H01L 29/42392 |
| | | | | 257/9 |
| 2015/0318290 A1* | 11/2015 | Liaw | ................... | H01L 27/1104 |
| | | | | 257/329 |

* cited by examiner

US 9,690,892 B2

MASKS BASED ON GATE PAD LAYOUT PATTERNS OF STANDARD CELL HAVING DIFFERENT GATE PAD PITCHES

BACKGROUND

In the design of modern integrated circuits, particularly digital circuits, standard cells having fixed functions are widely used. Standard cells are often pre-designed and stored in cell libraries. In some applications, a standard cell includes a group of transistor and interconnect structures that provide a Boolean logic function (e.g., AND, OR, XOR, XNOR, or INV), a storage function (e.g., flipflop or latch), or other predetermined functions. At the time integrated circuits (applications) are designed, the standard cells are retrieved from the cell libraries and placed into desirable locations. Routing is then performed to connect the standard cells with each other and with other customized circuits on the same chip. The overall area and power consumption of an integrated circuit thus depend on the area and power consumption of individual standard cells.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
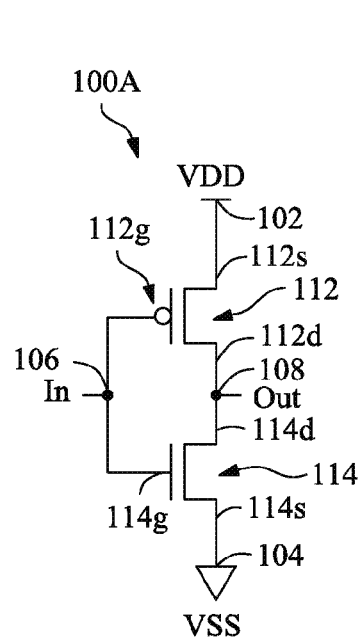
FIG. 1A is a circuit diagram of an inverter in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a standard cell has vertical gate-all-around (VGAA) transistors. Gate pads of the VGAA transistors in the standard cell have different widths, which in turn corresponds to different gate pad pitch and different columns of channel structures. As a result, if a first transistor of the standard cell is not required to be as powerful as a second transistor of the standard cell, the first transistor is configured to have a smaller gate pad pitch or gate pad width than those of the second transistor. Compared with a layout that has a universal gate pad width or gate pad pitch, the layout in accordance with one or more embodiments of the present disclosure results in a standard cell that occupies less area with less power consumption. In some embodiments, an integrated circuit is manufactured by performing one or more lithographic processes, growing processes, etching processes, or other processes based on a set of masks. In some embodiments, a set of masks is fabricated based on an integrated circuit layout design that depicts a plurality of features of the integrated circuit in various component layers.

FIG. 1A is a circuit diagram of an inverter 100A in accordance with some embodiments. In many applications, inverter 100A is a representative circuit of one of various types of standard cells. Inverter 100A includes a first power supply node 102, a second power supply node 104, an input node 106, an output node 108, a P-type transistor 112 between first power supply node 102 and output node 108, and an N-type transistor 114 between output node 108 and second power supply node 104.

First power supply node 102 is configured to receive a first power supply voltage VDD, and second power supply node 104 is configured to receive a second power supply voltage VSS. A source 112s of transistor 112 is coupled with first power supply node 102; a drain 112d of transistor 112 is coupled with output node 108; and a gate 112g of transistor 112 is coupled with input node 106. A source 114s of transistor 114 is coupled with second power supply node 104; a drain 114d of transistor 114 is coupled with output node 108; and a gate 114g of transistor 114 is coupled with input node 106.

Figure 1B:
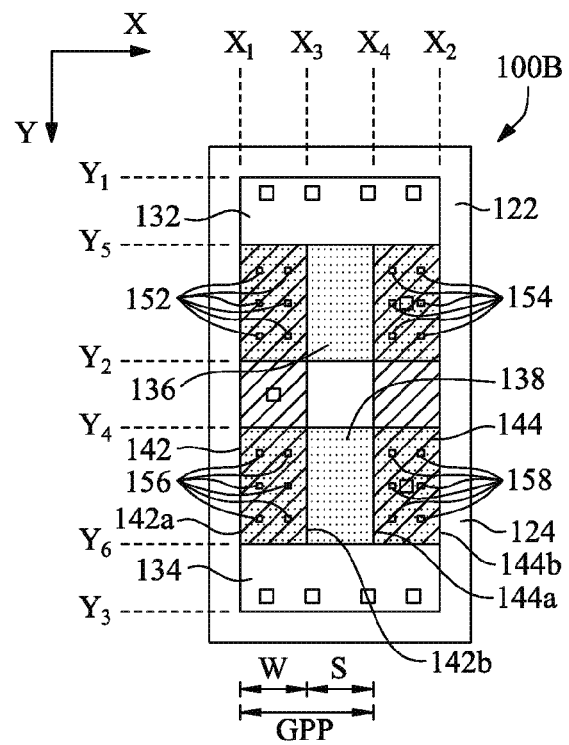
FIG. 1B is a layout diagram of an inverter standard cell in accordance with some embodiments.

FIG. 1B is a layout diagram of an inverter standard cell 100B in accordance with some embodiments. In some embodiments, the layout in FIG. 1B of inverter standard cell 100B is a layout implementation of inverter 100A. Inverter standard cell 100B is implemented by transistors having a configuration known as a vertical gate-all-around (VGAA) configuration. An example structure of VGAA transistor is further illustrated in conjunction with FIG. 1C.

The layout of inverter standard cell 100B includes an N-well layout pattern 122, a P-well layout pattern 124, a P-type transistor source pad layout pattern 132, an N-type transistor source pad layout pattern 134, a P-type transistor drain pad layout pattern 136, an N-type transistor drain pad layout pattern 138, a first gate pad layout pattern 142, and a second gate pad layout pattern 144. The layout of inverter standard cell 100B further includes channel structure layout patterns 152, 154, 156, and 158 overlapping the gate pad layout patterns 142 and 144.

Figure 1C:
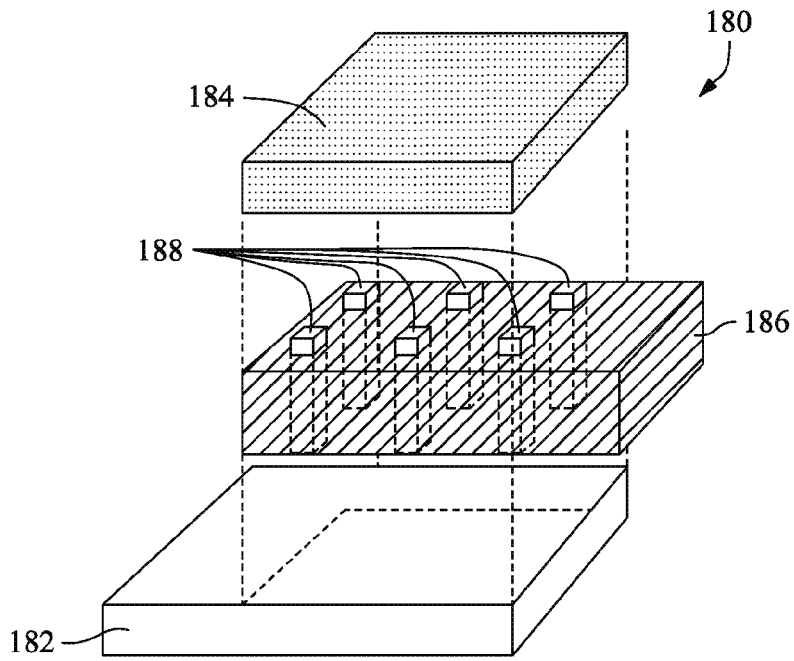
FIG. 1C is an exploded view of a transistor in accordance with some embodiments.

P-type transistor source pad layout pattern 132 or N-type transistor source pad layout pattern 134 is usable for forming a source pad structure, such as source pad 182 (FIG. 1C). P-type transistor drain pad layout pattern 136 or N-type transistor drain pad layout pattern 138 is usable for forming a drain pad structure, such as drain pad 184 (FIG. 1C). First gate pad layout pattern 142 or a second gate pad layout pattern 144 is usable for forming a gate pad structure, such as gate pad 186 (FIG. 1C). Channel structure layout patterns 152, 154, 156, and 158 are usable to form channel structures, such as channel structures 188.

P-type transistor source pad layout pattern 132 overlaps N-well layout pattern 122 and extends along an X direction from X1 to X2 and along a Y direction from Y1 to Y2. N-type transistor source pad layout pattern 134 overlaps P-well layout pattern 124 and extends along the X direction from X1 to X2 and along the Y direction from Y3 to Y4. P-type transistor drain pad layout pattern 136 overlaps P-type transistor source pad layout pattern 132 and extends along the X direction from X1 to X2 and along the Y direction from Y5 to Y2. N-type transistor drain pad layout pattern 138 overlaps N-type transistor source pad layout pattern 134 and extends along the X direction from X1 to X2 and along the Y direction from Y6 to Y4.

First gate pad layout pattern 142 and second gate pad layout pattern 144 partially overlap P-type transistor source pad layout pattern 132, N-type transistor source pad layout pattern 134, P-type transistor drain pad layout pattern 136, and N-type transistor drain pad layout pattern 138. First gate pad layout pattern 142 extends along the X direction from X1 to X3 and along the Y direction from Y5 to Y6. Second gate pad layout pattern 144 extends along the X direction from X2 to X4 and along the Y direction from Y5 to Y6.

The source pad formed based on P-type transistor source pad layout pattern 132, the channel structure formed based on channel structure layout patterns 152, the gate pad formed based on first gate pad layout pattern 142, and the drain pad formed based on P-type transistor drain pad layout pattern 136 define a first P-type transistor. The source pad formed based on P-type transistor source pad layout pattern 132, the channel structure formed based on channel structure layout patterns 154, the gate pad formed based on first gate pad layout pattern 144, and the drain pad formed based on P-type transistor drain pad layout pattern 136 define a second P-type transistor. The first and second P-type transistors correspond to P-type transistor 112 in FIG. 1A.

The source pad formed based on N-type transistor source pad layout pattern 134, the channel structure formed based on channel structure layout patterns 156, the gate pad formed based on first gate pad layout pattern 142, and the drain pad formed based on P-type transistor drain pad layout pattern 138 define a first N-type transistor. The source pad formed based on N-type transistor source pad layout pattern 134, the channel structure formed based on channel structure layout patterns 158, the gate pad formed based on first gate pad layout pattern 144, and the drain pad formed based on N-type transistor drain pad layout pattern 138 define a second N-type transistor. The first and second N-type transistors correspond to P-type transistor 112 in FIG. 1A.

First gate pad layout pattern 142 has a left side 142a and a right side 142b each extending along the Y direction, where right side 142b is further down along the X direction than left side 142a. Second gate pad layout pattern 144 has a left side 144a and a right side 144b each extending along the Y direction, where right side 144b is further down along the X direction than left side 144a. A gate pad pitch GPP of a gate pad layout pattern or the resulting gate pad is defined as a distance from the left side 142a of gate pad layout pattern 142 to the left side 144a of gate pad layout pattern 144. In some embodiments, a gate pad pitch is measurable as a distance from the right side 142b of gate pad layout pattern 142 to the right side 144b of gate pad layout pattern 144. In some embodiments, a gate pad pitch is measurable as a summation of a width of gate pad layout pattern 142 and a distance of a gap between gate layout pattern 142 and gate pad layout pattern 144.

FIG. 1C is an exploded view of a transistor 180 in accordance with some embodiments. Transistor 180 has a VGAA configuration and includes a source pad 182, a drain pad 184, a gate pad 186 between the source pad 182 and the drain pad 184, and channel structures 188. Channel structures 188 extend vertically through gate pad 186, or in other words, gate pad 186 surrounds channel structures 188. In some embodiments, channel structures 188 are arranged into one or more columns and rows. For example, in FIG. 1C, channel structures 188 are arranged into 2 columns and 3 rows. In some embodiments, the number of columns and rows of channel structures 188 varies with the performance requirements of individual transistors.

FIGS. 2-5B are layout diagrams of various standard cells using VGAA transistors arranged in a manner similar to those in FIGS. 1A-1C. The layout diagrams in FIGS. 2-5B are usable to form a standard cell that provide a Boolean logic function, such as AND, OR, XOR, XNOR, or INV. The layout styles illustrated below are applicable in other types of standard cells that use VGAA transistors, or other types of transistors having gate pads. The layout diagrams of various standard cells depicted in FIGS. 2-5B include gate pad layout patterns, channel structure layout patterns, and conductive line layout patterns depicted therein. The layout diagrams of various standard cells depicted in FIGS. 2-5B also include various well layout patterns, drain layout patterns, source layout patterns, and/or via layout patterns, which are omitted in FIGS. 2-5B) in order to facilitate the illustration of various embodiments of the present disclosure.

Figure 2:
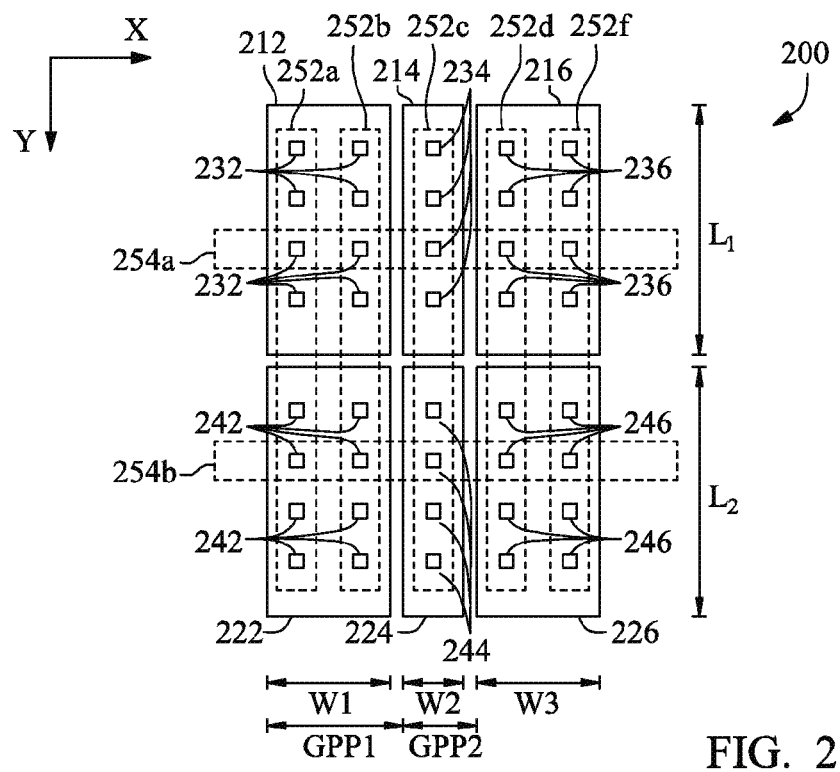
FIG. 2 is a layout diagram of a standard cell in accordance with some embodiments.

FIG. 2 is a layout diagram of a standard cell 200 in accordance with some embodiments. The layout of standard cell 200 includes gate pad layout patterns 212, 214, 216, 222, 224, and 226, channel structure layout patterns 232, 234, 236, 242, 244, 246, and conductive line layout patterns 252a-252e, 254a, and 254b.

Gate pad layout patterns 212, 214, and 216 are usable for forming gate pads for P-type transistors. Channel structure layout patterns 232, 234, and 236 overlap gate pad layout patterns 212, 214, and 216 and are usable for forming channel structures for the P-type transistors corresponding to gate pad layout patterns 212, 214, and 216. The resulting gate pad corresponding to gate pad layout patterns 212, 214, and 216 variously surround the resulting channel structures corresponding to channel structure layout patterns 232, 234, and 236.

Gate pad layout patterns 212, 214, and 216 each extend along the Y direction and are arranged one next to another along the X direction. Gate pad layout pattern 212 has a width W1 measurable along the X direction; gate pad layout pattern 214 has a width W2 measurable along the X direction; and gate pad layout pattern 216 has a width W3 measurable along the X direction. Gate pad layout patterns 212, 214, and 216 have a length L1 measurable along the Y direction. Gate pad layout pattern 214 is immediately adjacent, i.e., without any intervening patterns, to the right side of gate pad layout pattern 212.

The width of gate pad layout pattern 212 differs from the width of gate pad layout pattern 214, and the widths of gate pad layout pattern 214 and gate pad layout pattern 216 are different. A first gate pad pitch GPP1 is defined as a distance from the left side of gate pad layout pattern 212 to the left side of gate pad layout pattern 214. A second gate pad pitch GPP2 is defined as a distance from the left side of gate pad layout pattern 214 to the left side of gate pad layout pattern 216. Within a standard cell, the first gate pad pitch GPP1 and the second gate pad pitch GPP2 have different values.

Channel structure layout patterns 232, 234, and 236 are arranged into one or more columns and four rows. Channel structure layout patterns 232 have two columns, channel structure layout patterns 234 have one column, and channel structure layout patterns 236 have two columns.

Gate pad layout patterns 222, 224, and 226 each extend along the Y direction and one next to another along the X direction. Gate pad layout patterns 222, 224, and 226 are usable for forming gate pads for N-type transistors. Channel structure layout patterns 242, 244, and 246 overlap gate pad layout patterns 222, 224, and 226 and are usable for forming channel structures for the N-type transistors corresponding to gate pad layout patterns 222, 224, and 226. The resulting gate pad corresponding to gate pad layout patterns 222, 224, and 226 variously surround the resulting channel structures corresponding to channel structure layout patterns 242, 244, and 246.

Gate pad layout patterns 222, 224, and 226 each extend along the Y direction and are arranged one next to another along the X direction. Gate pad layout patterns 222, 224, and 226 have a length L2 measurable along the Y direction. Otherwise, gate pad layout patterns 222, 224, and 226 and channel structure layout patterns 242, 244, and 246 are arranged in a manner similar to that of gate pad layout patterns 212, 214, and 216 and channel structure layout patterns 252, 254, and 256. Detailed description thereof is thus omitted.

In some embodiments, the greater a number of channel structures in a transistor, the greater the driving capability and power consumption of the transistor. In some embodiments in a standard cell such as standard cell 200, the transistor corresponding to gate pad layout pattern 214 or 224 is not required to be as powerful as the transistor corresponding to gate pad layout pattern 212, 216, 222, or 226. Thus, gate pad layout pattern 214 or 224 is configured to have a smaller width and gate pad pitch and overlap fewer columns of channel structure layout patterns than gate pad layout pattern 212, 216, 222, or 226. Compared with a layout that has a universal gate pad width or gate pad pitch, the layout in FIG. 2 results in a standard cell that occupies less area with less power consumption. Advantages similar to those advanced above are also applicable to FIGS. 3-5B.

A first set of conductive line layout patterns 252a, 252b, 252c, 252d, and 252e are usable for forming a first set of conductive lines in a first interconnection layer. First set of conductive line layout patterns 252a-252e extends along the Y direction. In some embodiments, first set of conductive line layout patterns 252a-252e has a same line pitch. In this embodiment, gate pad layout patterns 212 and 214 overlap different numbers of first set of conductive line layout patterns 252a-252e, and gate pad layout patterns 222 and 224 overlap different numbers of first set of conductive line layout patterns 252a-252e. A second set of conductive line layout patterns 254a and 254b are usable for forming a second set of conductive lines in a second interconnection layer. Second set of conductive line layout patterns 254a-254b extends along the X direction.

In some embodiments, the first interconnection layer corresponds to interconnection layer M1 of a back-end-of-line (BEOL) process, the second interconnection layer corresponds to interconnection layer M2 of the BEOL process, and the second interconnection layer is over the first interconnection layer. In some embodiments, the first interconnection layer corresponds to interconnection layer M2, the second interconnection layer corresponds to interconnection layer M1, and the first interconnection layer is over the second interconnection layer.

Figure 3:
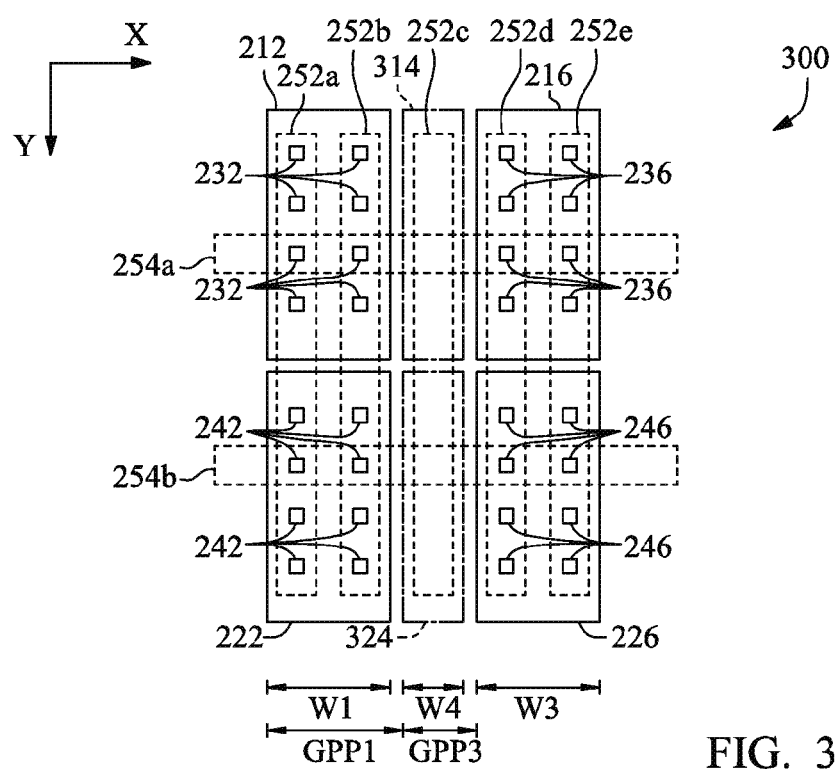
FIG. 3 is a layout diagram of another standard cell in accordance with some embodiments.

FIG. 3 is a layout diagram of another standard cell 300 in accordance with some embodiments. Components in FIG. 3 that are the same or similar to those in FIG. 2 are given the same reference numbers, and detailed description thereof is thus omitted.

Compared with standard cell 200, transistors corresponding to gate pad layout patterns 214 and 224 are omitted in standard cell 300. In FIG. 3, gate pad layout pattern 212 and gate pad layout pattern 216 are spaced apart along direction X. In some embodiments, a spacing between gate pad layout pattern 212 and gate pad layout pattern 216 has a width equal to a width of gate pad layout pattern 214 and gaps between gate pad layout patterns 212 and 214 and 214 and 216. In some embodiments, a spacing between gate pad layout pattern 212 and gate pad layout pattern 216 are sized sufficient to accommodate a reference gate pad layout pattern 314 between gate pad layout pattern 212 and gate pad layout pattern 216. The reference gate pad layout pattern 314 has a size corresponding to gate pad layout pattern 214 and is used as a space filler during the standard cell designing stage, but does not result in an actual layout pattern in the layout. The reference gate pad layout pattern 314 has a width W4 different from the width W1 of gate pad layout pattern 214 or the width W3 of gate pad layout pattern 216. A third gate pad pitch GPP3 is defined as a distance from the left side of gate pad layout pattern 212 to the left side of the reference gate pad layout pattern 314. Within a standard cell, the first gate pad pitch GPP1 and the third gate pad pitch GPP3 have different values.

Gate pad layout patterns 222 and 226 and reference gate pad layout pattern 324 are arranged in a manner similar to that of gate pad layout patterns 212 and 216 and reference gate pad layout pattern 314. Detailed description thereof is thus omitted.

Figure 4A:
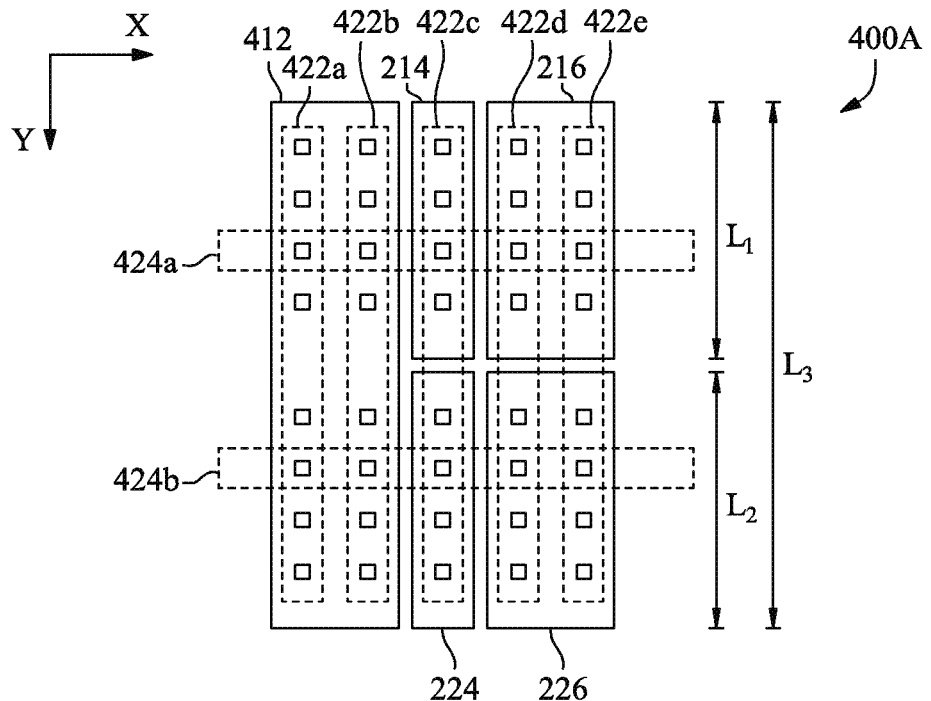
FIGS. 4A-5B are layout diagrams of various standard cells in accordance with some embodiments.

FIG. 4A is a layout diagram of a standard cell 400A in accordance with some embodiments. Components in FIG. 4A that are the same or similar to those in FIG. 2 are given the same reference numbers, and detailed description thereof is thus omitted. Reference numbers for channel structure layout patterns are omitted for clarity of the drawing.

Compared with standard cell 200, gate pads of standard cell 400A corresponding to gate pad layout patterns 212 and 222 are merged together. Therefore, the gate of the transistor corresponding to gate pad layout pattern 212 and the gate of the transistor corresponding to gate pad layout pattern 214 are electrically coupled together through the merged gate pad. In FIG. 4A, gate pad layout pattern 212 and gate pad layout pattern 222 are thus replaced by a merged gate pad layout pattern 412. Gate pad layout pattern 412 has a length L3 measurable along the Y direction. Length L3 is greater than length L1 or length L2, or the combination thereof. In some embodiments, length L3 equals the summation of length L1, length L2, and a distance of a gap between layout pattern 212 and 222, or 214 and 224, or 216 and 226.

Moreover, the layout of standard cell 400A includes conductive line layout patterns 422a-422e, 424a, and 424b corresponding to conductive line layout patterns 252a-252e, 254a, and 254b. A first set of conductive line layout patterns 422a, 422b, 422c, 422d, and 422e are usable for forming a first set of conductive lines in a first interconnection layer. First set of conductive line layout patterns 422a-422e extends along the Y direction. A second set of conductive line layout patterns 424a and 424b are usable for forming a second set of conductive lines in a second interconnection layer. Second set of conductive line layout patterns 424a-424b extends along the X direction. In some embodiments, the first interconnection layer corresponds to interconnection layer M1 of a BEOL process, the second interconnection layer corresponds to interconnection layer M2 of the BEOL process, and the second interconnection layer is over the first interconnection layer.

Figure 4B:
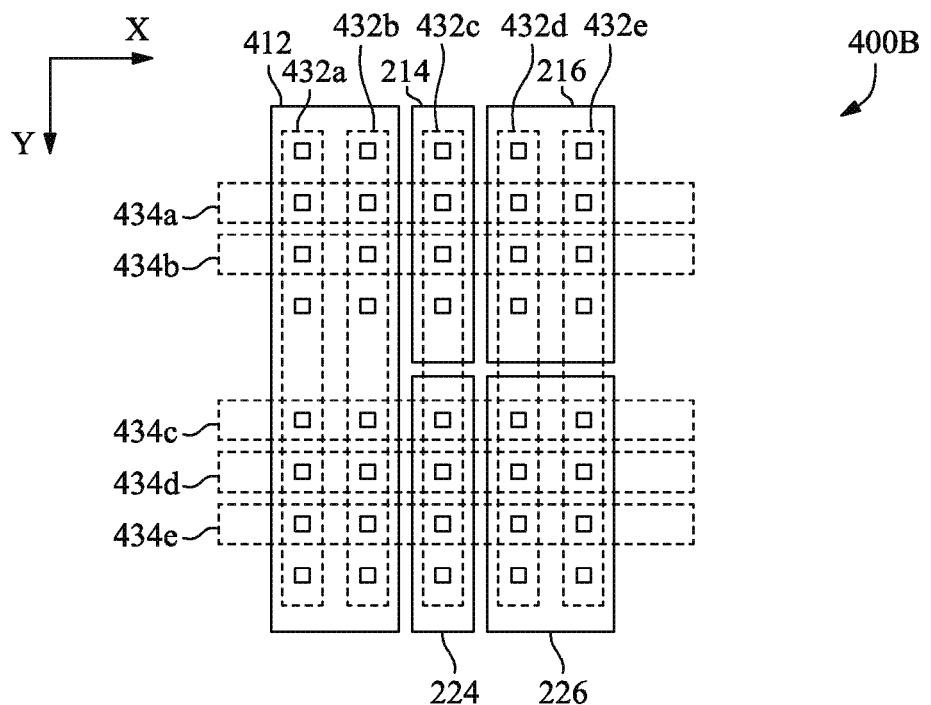

FIG. 4B is a layout diagram of a standard cell 400B in accordance with some embodiments. Components in FIG. 4B that are the same or similar to those in FIG. 4A are given the same reference numbers, and detailed description thereof is thus omitted.

Compared with the layout of standard cell 400A, the layout of standard cell 400B includes conductive line layout patterns 432a-432e and 434a-434e in place of conductive line layout patterns 422a-422e, 424a, and 424b. A first set of conductive line layout patterns 432a, 432b, 432c, 432d, and 432e are usable for forming a first set of conductive lines in a first interconnection layer. First set of conductive line layout patterns 432a-432e extends along the Y direction. A second set of conductive line layout patterns 434a, 434b, 434c, 434d, and 434e are usable for forming a second set of conductive lines in a second interconnection layer. Second set of conductive line layout patterns 434a-434e extends along the X direction. In some embodiments, the second interconnection layer corresponds to interconnection layer M1 of a BEOL process, the first interconnection layer corresponds to interconnection layer M2 of the BEOL process, and the first interconnection layer is over the second interconnection layer.

Figure 4C:
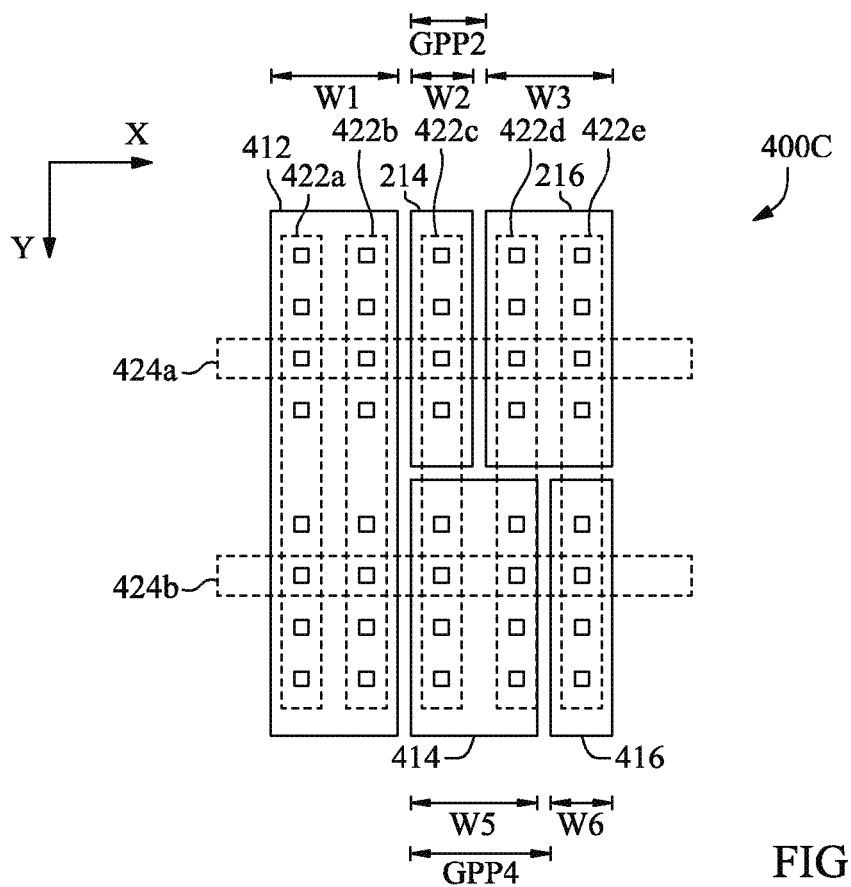

FIG. 4C is a layout diagram of a standard cell 400C in accordance with some embodiments. Components in FIG. 4C that are the same or similar to those in FIG. 4A are given the same reference numbers, and detailed description thereof is thus omitted.

Compared with the layout of standard cell 400A, the layout of standard cell 400C includes gate pad layout patterns 414 and 416 in place of gate pad layout patterns 224 and 226. Gate pad layout patterns 414 is further down along the Y direction than gate pad layout pattern 214; and gate pad layout patterns 416 is further down along the Y direction than gate pad layout pattern 216. As discussed in conjunction with FIG. 2, a gate pad pitch GPP2 is defined as a distance from a left side of gate pad layout pattern 214 to a left side of gate pad layout pattern 216. Moreover, a gate pad pitch GPP4 is defined as a distance from a left side of gate pad layout pattern 414 to a left side of gate pad layout pattern 416.

Gate pad layout pattern 412 has a width W1 measurable along the X direction; gate pad layout pattern 214 has a width W2 measurable along the X direction; and gate pad layout pattern 216 has a width W3 measurable along the X direction. Moreover, gate pad layout pattern 414 has a width W5 measurable along the X direction; and gate pad layout pattern 416 has a width W6 measurable along the X direction. The widths W2 and W5 are different, and the widths W3 and W6 are different. Also, gate pad pitch GPP2 and gate pad pitch GPP4 have different values. In other words, gate pad layout patterns 214 and 414 (or gate pad layout patterns 216 and 416) have different widths, and the corresponding left and right sides thereof are not all aligned along the Y direction. In some embodiments, the widths W1, W3, and W5 are the same, and the widths W2 and W6 are the same.

Figure 4D:
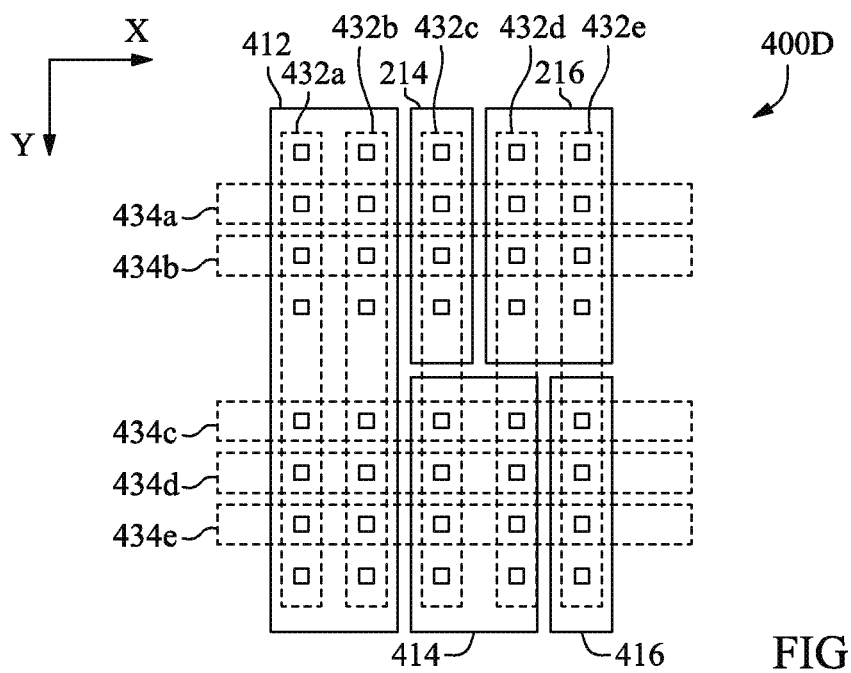

FIG. 4D is a layout diagram of a standard cell 400D in accordance with some embodiments. Components in FIG. 4D that are the same or similar to those in FIG. 4C and FIG. 4A are given the same reference numbers, and detailed description thereof is thus omitted.

Compared with the layout of standard cell 400C, the layout of standard cell 400D includes conductive line layout patterns 432a-432e and 434a-434e in place of conductive line layout patterns 422a-422e, 424a, and 424b. Detail description of conductive line layout patterns 432a-432e is thus omitted.

Figure 5A:
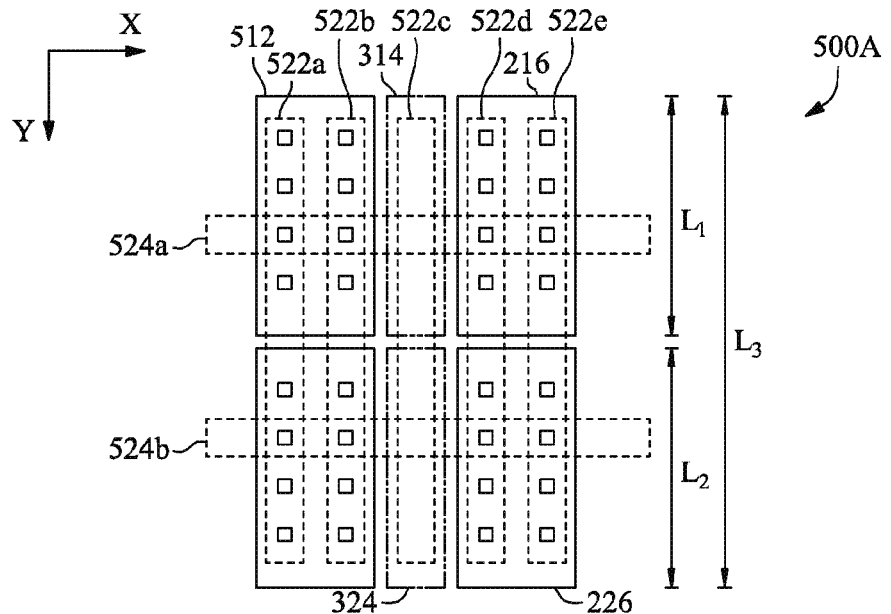

FIG. 5A is a layout diagram of a standard cell 500A in accordance with some embodiments. Components in FIG. 5A that are the same or similar to those in FIG. 3 are given the same reference numbers, and detailed description thereof is thus omitted. Reference numbers for channel structure layout patterns are omitted for clarity of the drawing.

Compared with standard cell 300, gate pads of standard cell 500A corresponding to gate pad layout patterns 212 and 222 are merged together. In FIG. 5A, gate pad layout pattern 212 and gate pad layout pattern 222 are replaced by gate pad layout pattern 512. Gate pad layout pattern 512 corresponds to gate pad layout pattern 412 and has a length L3 measurable along the Y direction. Detail description of gate pad layout pattern 512 is thus omitted.

Moreover, the layout of standard cell 500A includes conductive line layout patterns 522a-522e, 524a, and 524b. A first set of conductive line layout patterns 522a, 522b, 522c, 522d, and 522e corresponds to conductive line layout patterns 222a-222e or 422a-422e, and are usable for forming a first set of conductive lines in a first interconnection layer. A second set of conductive line layout patterns 524a and 524b corresponds to conductive line layout patterns 224a and 224b or 424a and 424b, and are usable for forming a second set of conductive lines in a second interconnection layer. In some embodiments, the first interconnection layer corresponds to interconnection layer M1 of a BEOL process, the second interconnection layer corresponds to interconnection layer M2 of the BEOL process, and the second interconnection layer is over the first interconnection layer.

Figure 5B:
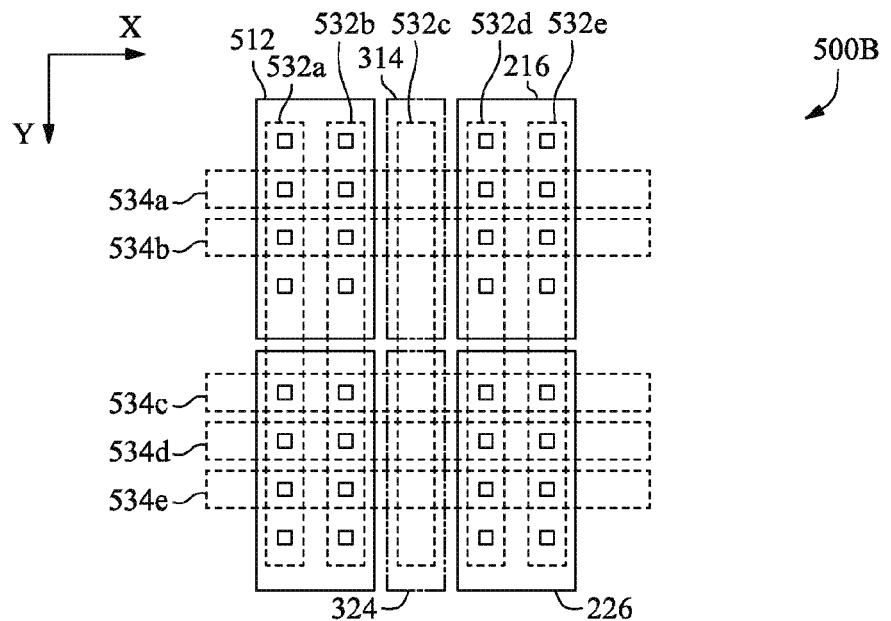

FIG. 5B is a layout diagram of a standard cell 500B in accordance with some embodiments. Components in FIG. 5B that are the same or similar to those in FIG. 5A are given the same reference numbers, and detailed description thereof is thus omitted.

Compared with the layout of standard cell 500A, the layout of standard cell 500B includes conductive line layout patterns 532a-532e and 534a-534e in place of conductive line layout patterns 522a-522e, 524a, and 524b. A first set of conductive line layout patterns 532a, 532b, 532c, 532d, and 532e corresponds to conductive line layout patterns 432a-432e, and are usable for forming a first set of conductive lines in a first interconnection layer. A second set of conductive line layout patterns 534a, 534b, 534c, 534d, and 534e corresponds to conductive line layout patterns 432a-432e, and are usable for forming a second set of conductive lines in a second interconnection layer. In some embodiments, the second interconnection layer corresponds to interconnection layer M1 of a BEOL process, the first interconnection layer corresponds to interconnection layer M2 of the BEOL process, and the first interconnection layer is over the second interconnection layer.

Figure 6:
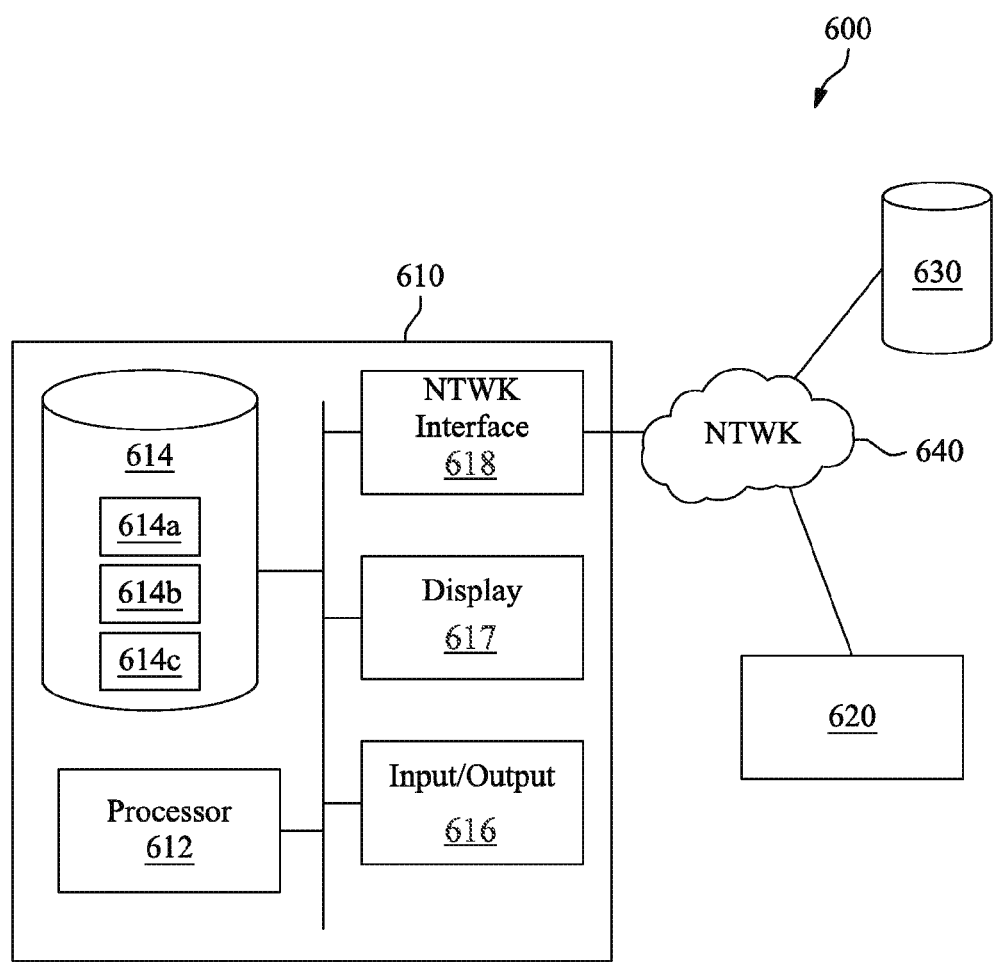
FIG. 6 is a block diagram of an integrated circuit designing system in accordance with some embodiments.

FIG. 6 is a block diagram of an integrated circuit (IC) designing system 600 in accordance with some embodiments. IC designing system 600 includes a first computer system 610, a second computer system 620, a networked storage device 630, and a network 640 connecting the first computer system 610, the second computer system 620, and the networked storage device 630. In some embodiments, one or more of the second computer system 620, the storage device 630, and the network 640 are omitted.

The first computer system 610 includes a hardware processor 612 communicatively coupled with a non-transitory, computer readable storage medium 614 encoded with, i.e., storing, a set of instructions 614a, a standard cell layout library 614b, or any intermediate data 614c for executing the set of instructions 614a. The processing unit 612 is electrically and communicatively coupled with the computer readable storage medium 614. The processing unit 612 is configured to execute the set of instructions 614a encoded in the computer readable storage medium 614 in order to cause the computer 610 to be usable as an IC designing system, including functionalities such as manual or automated place-and-route tool based on the standard cell layout library 614b including standard cells consistent with the embodiments of FIGS. 2-5B.

In some embodiments, the set of instructions 614a, the standard cell layout library 614b, or the intermediate data 614c are stored in a non-transitory storage medium other than storage medium 614. In some embodiments, some or all of the set of instructions 614a, standard cell layout library 614b, or the intermediate data 614c are stored in a non-transitory storage medium in networked storage device 630 or second computer system 620. In such case, some or all of the set of instructions 614a, the original layout file 614b, the final modified layout file 614c, or the intermediate data 614d stored outside computer 610 is accessible by the processing unit 612 through the network 740.

In some embodiments, the processor 612 is a central processing unit (CPU), a multi-processor, a distributed processing system, an application specific integrated circuit (ASIC), and/or a suitable processing unit.

In some embodiments, the computer readable storage medium 614 is an electronic, magnetic, optical, electromagnetic, infrared, and/or a semiconductor system (or apparatus or device). For example, the computer readable storage medium 614 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 614 includes a compact disk-read only memory (CD-ROM), a compact disk-read/write (CD-R/W), and/or a digital video disc (DVD).

The computer system 610 further includes, in at least some embodiments, an input/output interface 616 and a display unit 617. The input/output interface 616 is coupled to the processor 612 and allows the circuit designer to manipulate the first computer system 610. In at least some embodiments, the display unit 617 displays the status of executing the set of instructions 614a and, in at least some embodiments, provides a Graphical User Interface (GUI). In at least some embodiments, the display unit 617 displays the status of executing the set of instructions 614a in a real time manner. In at least some embodiments, the input/output interface 616 and the display 617 allow an operator to operate the computer system 610 in an interactive manner.

In at least some embodiments, the computer system 610 also includes a network interface 618 coupled to the processor 612. The network interface 618 allows the computer system 610 to communicate with the network 640, to which one or more other computer systems are connected. The network interface includes wireless network interfaces such as BLUETOOTH, WIFI, WIMAX, GPRS, or WCDMA; or wired network interface such as ETHERNET, USB, or IEEE-1394.

In accordance with one embodiment, a layout design usable for manufacturing a standard cell includes a first gate pad layout pattern, a first set of channel structure layout patterns overlapping the first gate pad layout pattern, a second gate pad layout pattern, and a second set of channel structure layout patterns overlapping the second gate pad layout pattern. The first gate pad layout pattern extends along the first direction. The second gate pad layout pattern extends along the second direction. The first set of channel structure layout patterns is arranged into a first number of columns each aligned along the first direction. The second set of channel structure layout patterns is arranged into a second number of columns each aligned along the first direction. The first number and the second number are different.

In accordance with another embodiment, a layout design usable for manufacturing a standard cell. The layout design includes a first gate pad layout pattern usable for forming a first gate pad surrounding a first set of channel structures of the standard cell, a second gate pad layout pattern usable for forming a second gate pad surrounding a second set of channel structures of the standard cell, and a third gate pad layout pattern usable for forming a third gate pad surrounding a third set of channel structures of the standard cell. The first gate pad layout pattern has a first side and a second side extending along a first direction, and the second side is further down along a second direction than the first side. The second gate pad layout pattern having a first side and a second side extending along the first direction, and the second side is further down along the second direction than the first side. The second gate pad layout pattern is immediately adjacent, i.e., without any intervening layout patterns, to the second side of the first gate pad layout pattern, and a first gate pad pitch is a distance from the first side of the first gate pad layout pattern to the first side of the second gate pad layout pattern. The third gate pad layout pattern has a first side and a second side extending along the first direction, and the second side is further down along the second direction than the first side. The third gate pad layout pattern is immediately adjacent to the second side of the second gate pad layout pattern, and a second gate pad pitch is a distance from the second side of the first gate pad layout pattern to the first side of the third gate pad layout pattern. The first gate pad pitch and the second gate pad pitch have different values.

In accordance with another embodiment, a non-transitory storage medium usable in an integrated circuit designing system, and the non-transitory storage medium is encoded with a layout design of a standard cell. The layout design includes a first gate pad layout pattern, a first set of channel structure layout patterns overlapping the first gate pad layout pattern, a second gate pad layout pattern, and a second set of channel structure layout patterns overlapping the second gate pad layout pattern. The first gate pad layout pattern extends along the first direction and has a first width measurable along a second direction. The second gate pad layout pattern extends along the second direction and has a second width measurable along the second direction. The first width and the second width are different.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A set of masks corresponding to a layout design of a standard cell, the layout design comprising:
   a first gate pad layout pattern extending along a first direction;
   a first set of channel structure layout patterns overlapping the first gate pad layout pattern, the first set of channel structure layout patterns being arranged into a first number of columns each aligned along the first direction;
   a second gate pad layout pattern extending along a second direction; and
   a second set of channel structure layout patterns overlapping the second gate pad layout pattern, the second set of channel structure layout patterns being arranged into a second number of columns each aligned along the first direction,
   the first number and the second number being different,
   wherein the set of masks is formed based on the layout design.

2. The set of masks of claim 1, wherein the first number is 2, and the second number is 1.

3. The set of masks of claim 1, wherein the layout design further comprises:
   a third gate pad layout pattern extending along the second direction;
   the first gate pad layout pattern and the third gate pad layout pattern being spaced apart along the second direction, a spacing therebetween being sized sufficient to accommodate a reference gate pad layout pattern, the reference gate pad layout pattern having a width different from at least that of the first gate pad layout pattern or that of the third gate pad layout pattern.

4. The set of masks of claim 1, wherein the layout design further comprises:
   a first set of conductive line layout patterns usable for forming a first set of conductive lines in a first interconnection layer, the first set of conductive line layout patterns extending along the first direction; and
   a second set of conductive line layout patterns usable for forming a second set of conductive lines in a second interconnection layer, the second set of conductive line layout patterns extending along the second direction.

5. The set of masks of claim 4, wherein the first set of conductive line layout patterns has a same line pitch.

6. The set of masks of claim 4, wherein the first interconnection layer is over the second interconnection layer.

7. The set of masks of claim 4, wherein the second interconnection layer is over the first interconnection layer.

8. The set of masks of claim 4, wherein
   the first gate pad layout pattern has a first length measurable along the first direction;
   the second gate pad layout pattern has a second length measurable along the first direction; and
   the first and second lengths are different.

9. A set of masks corresponding to a layout design of a standard cell, the layout design comprising:
   a first gate pad layout pattern extending along a first direction and having a first width measurable along a second direction;
   a first set of channel structure layout patterns overlapping the first gate pad layout pattern;
   a second gate pad layout pattern extending along the second direction and having a second width measurable along the second direction; and
   a second set of channel structure layout patterns overlapping the second gate pad layout pattern,
   the first width and the second width being different,
   wherein the set of masks is formed based on the layout design.

10. The set of masks of claim 9, wherein
    the first set of channel structure layout patterns being arranged into a first number of columns each aligned along the first direction;
    the second set of channel structure layout patterns being arranged into a second number of columns each aligned along the first direction; and
    the first number and second number are different.

11. The set of masks of claim 9, wherein
    the first gate pad layout pattern has a first length measurable along the first direction;
    the second gate pad layout pattern has a second length measurable along the first direction; and
    the first and second lengths are different.

12. The set of masks of claim 11, wherein the layout design further comprises a third gate pad layout pattern extending along the second direction, the third gate pad layout pattern having the second length measurable along the first direction and a third width measurable along the second direction.

13. The set of masks of claim 12, wherein the first width and the third width are the same.

14. The set of masks of claim 9, wherein the layout design further comprises:
    a first set of conductive line layout patterns usable for forming a first set of conductive lines in a first interconnection layer, the first set of conductive line layout patterns extending along the first direction; and
    a second set of conductive line layout patterns usable for forming a second set of conductive lines in a second interconnection layer, the second set of conductive line layout patterns extending along the second direction.

15. A set of masks corresponding to a layout design of a standard cell, the layout design comprising:
    a first gate pad layout pattern extending along a first direction;
    a first set of channel structure layout patterns overlapping the first gate pad layout pattern, the first set of channel structure layout patterns being arranged into a first number of columns each aligned along the first direction;
    a second gate pad layout pattern extending along a second direction;
    a second set of channel structure layout patterns overlapping the second gate pad layout pattern, the second set of channel structure layout patterns being arranged into a second number of columns each aligned along the first direction;
    a third gate pad layout pattern extending along the second direction; and
    a third set of channel structure layout patterns overlapping the third gate pad layout pattern, the third set of channel structure layout patterns being arranged into the first number of columns each aligned along the first direction, the first number and the second number being different, wherein the set of masks is formed based on the layout design.

16. The set of masks of claim 15, wherein the first number is 2, and the second number is 1.

17. The set of masks of claim 15, wherein the third gate pad layout pattern is between the first gate pad layout pattern and the second gate pad layout pattern.

18. The set of masks of claim 15, wherein the second gate pad layout pattern is between the first gate pad layout pattern and the third gate pad layout pattern.

19. The set of masks of claim 15, wherein the layout design further comprises:
 a fourth gate pad layout pattern; and
 a fourth set of channel structure layout patterns overlapping the fourth gate pad layout pattern, the fourth set of channel structure layout patterns including a channel structure layout column aligned along the first direction, the channel structure layout column being further aligned along the first direction with a column of one of the first set of channel structure layout patterns, the second set of channel structure layout patterns, or the third set of channel structure layout patterns.

20. The set of masks of claim 15, wherein the layout design further comprises:
 a first set of conductive line layout patterns usable for forming a first set of conductive lines in a first interconnection layer, the first set of conductive line layout patterns extending along the first direction; and
 a second set of conductive line layout patterns usable for forming a second set of conductive lines in a second interconnection layer, the second set of conductive line layout patterns extending along the second direction.

* * * * *